United States Patent
Schlueter et al.

(10) Patent No.: US 9,726,711 B2
(45) Date of Patent: Aug. 8, 2017

(54) POWER SEMICONDUCTOR MODULE COMPRISING A POWER ELECTRONICS CIRCUIT AND AN ARRANGEMENT FOR MEASURING AND TRANSFERRING MEASUREMENT DATA

(71) Applicant: Infineon Technologies AG, Neubiberg (DE)

(72) Inventors: Michael Schlueter, Hannover-Herrenhausen (DE); Stefan Hubert Schmies, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 510 days.

(21) Appl. No.: 14/300,272

(22) Filed: Jun. 10, 2014

(65) Prior Publication Data

US 2014/0368231 A1    Dec. 18, 2014

(30) Foreign Application Priority Data

Jun. 18, 2013  (DE) .......... 10 2013 211 386

(51) Int. Cl.
 G01R 31/26     (2014.01)
 G08C 19/02     (2006.01)
 H04Q 9/00      (2006.01)

(52) U.S. Cl.
 CPC ......... *G01R 31/2607* (2013.01); *G08C 19/02* (2013.01); *H04Q 9/00* (2013.01)

(58) Field of Classification Search
 CPC .... G01R 31/40; G01R 31/2607; G01R 31/30; H01L 2924/00014; H01L 27/11521;

(Continued)

(56) References Cited

U.S. PATENT DOCUMENTS 8,782,503 B2 *  7/2014  Kaeriyama ........ H03K 17/0828
                                              324/754.27
8,972,216 B2 *  3/2015  Tang ..................... H02M 3/156
                                              323/282
2010/0013321 A1   1/2010  Onishi et al.

FOREIGN PATENT DOCUMENTS

CN        1444793 A      9/2003
CN        1502196 A      6/2004
(Continued)

*Primary Examiner* — Melissa Koval
*Assistant Examiner* — Trung Nguyen
(74) *Attorney, Agent, or Firm* — Murphy, Bilak & Homiller, PLLC

(57) ABSTRACT

A power semiconductor module includes a power electronics circuit and a measuring circuit for measuring a physical parameter occurring in the power electronics circuit and for providing a corresponding measurement signal. A transmission circuit is coupled to a secondary side of a transfer unit, and an evaluation circuit is coupled to the primary side and galvanically isolated from the transmission circuit by the transfer unit. The evaluation circuit supplies an AC voltage to the primary side, causing primary current to flow on the primary side, which in turn results in secondary current on the secondary side, the secondary current being supplied to the transmission circuit. The transmission circuit receives the measurement signal and modulates the secondary current in accordance with the measurement signal, which results in a modulation of the primary current. The evaluation circuit evaluates the modulation of the primary current and generates an output signal dependent thereon.

23 Claims, 5 Drawing Sheets

(58) Field of Classification Search
CPC ........ G01N 27/22; G01S 19/235; H04Q 9/00; H04L 25/0294
USPC ......... 324/414, 762.08, 762.07, 762.09, 410, 324/403, 500–555; 702/57, 130, 136, 60, 702/63, 82
See application file for complete search history.

(56) References Cited

FOREIGN PATENT DOCUMENTS

| | | |
|---|---|---|
| CN | 201623652 U | 11/2010 |
| CN | 102106054 A | 6/2011 |
| CN | 102130477 A | 7/2011 |
| CN | 102130510 A | 7/2011 |
| DE | 102008049673 A1 | 4/2010 |
| EP | 2375532 A2 | 10/2011 |

\* cited by examiner

POWER SEMICONDUCTOR MODULE COMPRISING A POWER ELECTRONICS CIRCUIT AND AN ARRANGEMENT FOR MEASURING AND TRANSFERRING MEASUREMENT DATA

PRIORITY CLAIM

This application claims priority to German Patent Application No. 10 2013 211 386.2, filed on 18 Jun. 2013, the content of said German application incorporated herein by reference in its entirety.

TECHNICAL FIELD

The invention relates to a power semiconductor module, in particular an arrangement for measuring and transferring parameters of a power semiconductor module.

BACKGROUND

In order to monitor in particular power semiconductors, various parameters are often measured in electronic circuits. A high operating temperature and thermal cycling can impair, for example, the component efficiency and the failsafety of the components to a not inconsiderable extent. In order to avoid failures of components, the temperature is therefore measured, for example, in order to be able to adopt safety measures in the event that a limit value is exceeded. However, other parameters such as currents or voltages can also be measured.

In power converters (converters), for example, the temperature and the DC link voltage are measured. The power semiconductor components of a power converter are in this case supplied a high voltage (for example 0.3-1.7 kV), whereas the measuring circuit and the evaluation circuit, which implement the measurement and the measurement data processing, operate on a low supply voltage (for example 15 V). The measurement electronics are therefore usually galvanically isolated from the evaluation electronics.

Generally, the control circuit for the converter is supplied via a reinforced insulation transformer. The data transfer from the measuring circuit, which can be part of the control circuit, to the evaluation circuit takes place via separate transfer elements or via optocouplers. For this purpose, a large number of components is required, which results in a high space requirement and high costs of the entire module.

SUMMARY

Embodiments described herein provide a circuit arrangement which is improved over the prior art and which can be implemented more compactly and at lower cost.

A power semiconductor module is described. In accordance with a first aspect of the present invention, the power semiconductor module comprises a power electronics circuit and a measuring circuit, which is designed to measure at least one physical parameter occurring in the power electronics circuit and to provide a measurement signal which represents the measured parameter ($M_X$). The power semiconductor module furthermore comprises a transfer unit with a primary side and a secondary side, a transmission circuit, which is coupled to the secondary side, and an evaluation circuit, which is coupled to the primary side and which is galvanically isolated from the transmission circuit by the transfer unit. The evaluation circuit is designed to supply an AC voltage to the primary side of the transfer unit, as a result of which a corresponding primary current flows on the primary side, which in turn results in a secondary current on the secondary side of the transfer unit, which secondary current is supplied to the transmission circuit. The transmission circuit is designed to receive the measurement signal from the measuring circuit and to modulate the secondary current in accordance with the measurement signal, which results in a corresponding modulation of the primary current. The evaluation circuit is furthermore designed to evaluate the modulation of the primary current and to generate an output signal dependent thereon.

Furthermore, a method for measuring and transferring circuit parameters measured in a power semiconductor module is described.

In accordance with a further aspect of the invention, the method comprises generating a primary current on the primary side of a transfer unit by virtue of supplying an AC voltage to the primary side, wherein the primary current results in a secondary current on a secondary side of the transfer unit, which secondary side is galvanically isolated from the primary side. The method further comprises measuring at least one parameter of a power electronics circuit and providing a measurement signal which represents the measured parameter. The secondary current is modulated in accordance with the measurement signal, which results in a corresponding modulation of the primary current. The resultant modulation of the primary current is evaluated and an output signal dependent on the evaluation is generated.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
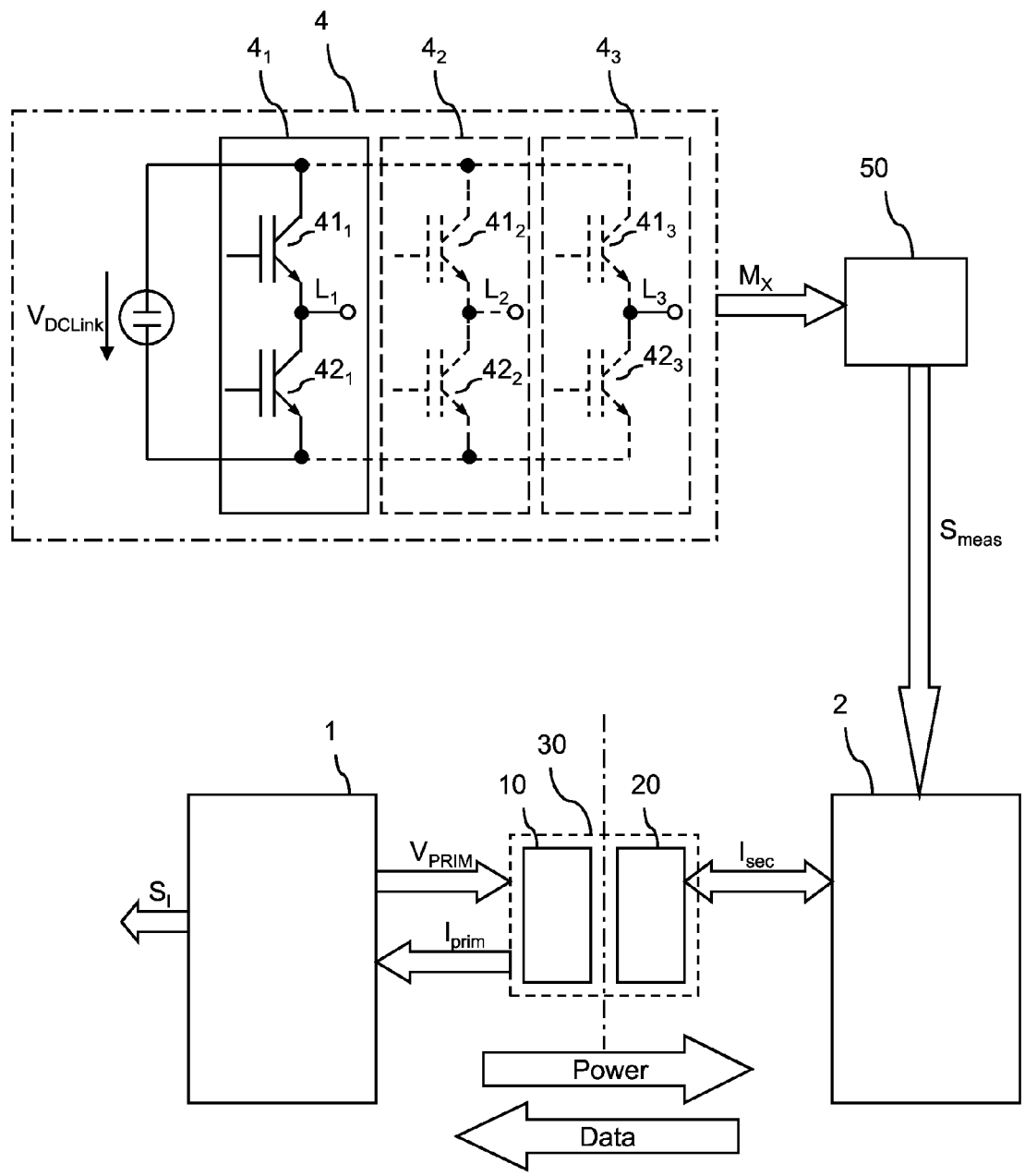
FIG. 1 shows a power semiconductor module in accordance with one example of the invention.

FIG. 1 shows a power semiconductor module in accordance with one example of the invention. The power semiconductor module comprises a power electronics circuit 4, for example a power converter circuit comprising three transistor half-bridges for generating a three-phase alternating current (three-phase inverter circuit). In the present example, these three transistor half-bridges are constructed from six IGBTs (Insulated-Gate Bipolar Transistors). Alternatively, MOSFETs (Metal-Oxide Semiconductor Field-Effect Transistors), bipolar transistors or the like could also be used. In the example in FIG. 1, the half-bridges are denoted by $4_1$, $4_2$, and $4_3$. Each half-bridge $4_1$, $4_2$, $4_3$ can generate a corresponding AC output voltage from a DC voltage $V_{DClink}$. For this, the individual semiconductor switches $41_1$, $42_1$, $41_2$, $42_2$, $41_3$, $42_3$ from which the half-bridges are constructed are driven correspondingly at their control connections. A three-phase power converter having three half-bridges $4_1$, $4_2$, $4_3$ connected in parallel can provide, for example, three AC output voltages for a three-phase AC system (not illustrated).

Each of the half-bridges $4_1$, $4_2$, $4_3$ in this case comprises, for example, two series-connected power switches $41_1$ and $42_1$, $41_2$ and $42_2$, $41_3$ and $42_3$, which are each connected in series between a first and a second potential of the DC link $V_{DClink}$. Such power converters and their function have already long been known and are not described in detail here. The application of the invention is restricted to an application with power converters, but can be used for any power electronics applications. The power electronics circuit 4 can also have other components in addition to a number of power switches, for example diodes or the like.

In order to protect the components of the power electronics circuit 4 or for the purpose of controlling or monitoring the power converter, measurements of various parameters of the circuit can take place. For example, the current in the DC link or the output currents can be measured. In order to protect against excessively high temperatures, the temperature of the power semiconductor components 41, 42 can be measured. In this case, power semiconductor components with an integrated temperature sensor (for example NTC thermistors) are often used (NTC=Negative Temperature Coefficient). A measurement of the DC link voltage $V_{DClink}$ is often desired as well.

The block circuit diagram illustrated in FIG. 1 shows a power converter module as an example of a power semiconductor module. The power converter module comprises, in addition to the abovementioned power electronics circuit (three-phase inverter circuit 4), a measuring circuit 50 for measuring one or more physical parameters $M_X$ occurring in the power electronics circuit 4. The parameter(s) $M_X$ can include the following, for example: temperatures occurring in the module, currents, the DC link voltage (or voltages occurring at another point), phase angle, etc. For this, the measuring circuit 50 can have in each case suitable sensors, such as, for example, shunt resistors, Hall sensors or similar current sensors for measuring currents, temperature measuring resistors (for example NTC thermistors), etc.

The measuring circuit 50 detects and processes the parameter(s) $M_X$ to be measured and provides a measurement signal $S_{meas}$. This measurement signal $S_{meas}$ represents the measured parameter(s) $M_X$ and can be in digital form, for example, i.e. as a sequence of binary data words. Evaluation or further-processing of the measurement signal $S_{meas}$ generally does not take place in the measuring circuit 50 itself, but in a separate evaluation circuit 1. This evaluation circuit is generally galvanically isolated from the power electronics circuit 4 and the measuring circuit 50. Depending on the application, the mentioned galvanic isolation can be desirable or necessary, since the power electronics circuit 4 is operated on a high voltage (for example 0.3-1.7 kV), while the circuit components for evaluating the measurement signals or for the measurement signal processing operate on a low voltage (for example 0-15 V). A transfer unit 30, which ensures the galvanic isolation of the power electronics circuit 4 and the measuring circuit 50 from the evaluation circuit 1, is provided for the transfer of the measurement data (signal $S_{meas}$) to the evaluation unit 1. The transfer unit 30 has a primary side comprising a primary winding 10 and a secondary side comprising a secondary winding 20. The transfer unit 30 is a magnetic transfer element, for example a transformer.

The evaluation circuit 1 (reception circuit) is connected to the primary side 10 of the transfer unit 30. A transmission circuit 2 (transmission circuit) is connected to the secondary side 20 of the transfer unit 30. The evaluation circuit 1 and the transmission circuit 2 are therefore galvanically isolated from one another. In addition to data transfer, the transformer 30 is also used for transferring electrical energy. The transformer 30 can therefore be used for supplying energy (voltage) to the transmission circuit and the measuring circuit.

If the transfer unit 30 is connected to an AC voltage $V_{PRIM}$ on the primary side, for example, which AC voltage is generated in the present example with the aid of a transistor output stage in the evaluation circuit 1 from a DC supply voltage V+. As a result, a corresponding voltage is induced on the secondary side 20. This voltage can be used to supply energy to the transmission circuit 2 and the measuring circuit. The AC voltage $V_{PRIM}$ which is supplied to the primary side 10 of the transfer unit 30 can be provided by the evaluation circuit 1, for example. In this case, the evaluation circuit also provides for the supply of energy to the circuits connected to the secondary side of the transformer 30 (transmission circuit 2, measuring circuit 50). If the primary side 10 of the transformer 30 is supplied a square-wave voltage (as AC voltage $V_{PRIM}$), for example, which has 0V during a switch-off phase and a maximum voltage value $V_{max}$ during a switch-on phase, energy is transferred to the secondary side 20 in each case during the switch-off process (i.e. during the transition from $V_{max}$ to zero).

In order to transfer the measurement signal $S_{meas}$ to the evaluation circuit 1, the transmission circuit 2 receives the measurement $S_{meas}$ from the measuring circuit 50. Owing to the AC voltage $V_{PRIM}$, which is supplied on the primary side to the transfer unit 30, a primary current $I_{prim}$ flows on the primary side 10 of the transfer unit 30. This primary current $I_{prim}$ on the primary side 10 results in a corresponding secondary current $I_{sec}$, which is used inter alia for supplying the transmission circuit 2 and the measuring circuit 50. The transmission circuit 2 is designed to modulate the secondary current $I_{sec}$ in accordance with the measurement signal $S_{meas}$. The modulation can consist in varying (increasing or decreasing) the secondary current $I_{sec}$ in a targeted manner by a known value $\Delta I_{sec}$. A modulation of the secondary current $I_{sec}$ results in a corresponding modulation of the primary current $I_{prim}$. By virtue of the modulation of the secondary current $I_{sec}$, therefore, information can be transferred from the secondary side 20 of the transformer 30 to the primary side 10 thereof, i.e. from the transmission circuit 2 to the evaluation circuit 1. By virtue of an evaluation (demodulation) of the primary current $I_{prim}$, the transferred data can be retrieved. The evaluation circuit 1 can provide, for example, a signal $S_I$ for further evaluation and processing, which signal represents the measured primary current $I_{prim}$ or the measured change in the primary current $\Delta I_{prim}$. The principle of data transfer will be described in more detail below.

If the secondary current $I_{sec}$ is being modulated, this also results in a corresponding modulation of the primary current $I_{prim}$. The primary current $I_{prim}$ is dependent on the secondary current $I_{sec}$ and a linearly rising magnetization current of the transformer 30. This is illustrated in the first timing diagram in FIG. 2. Said diagram shows the primary current $I_{prim}$ measured on the primary side at different time intervals T0, T1, T2, T3, during which data transfer (i.e. modulation of the secondary current) takes place.

Figure 2:
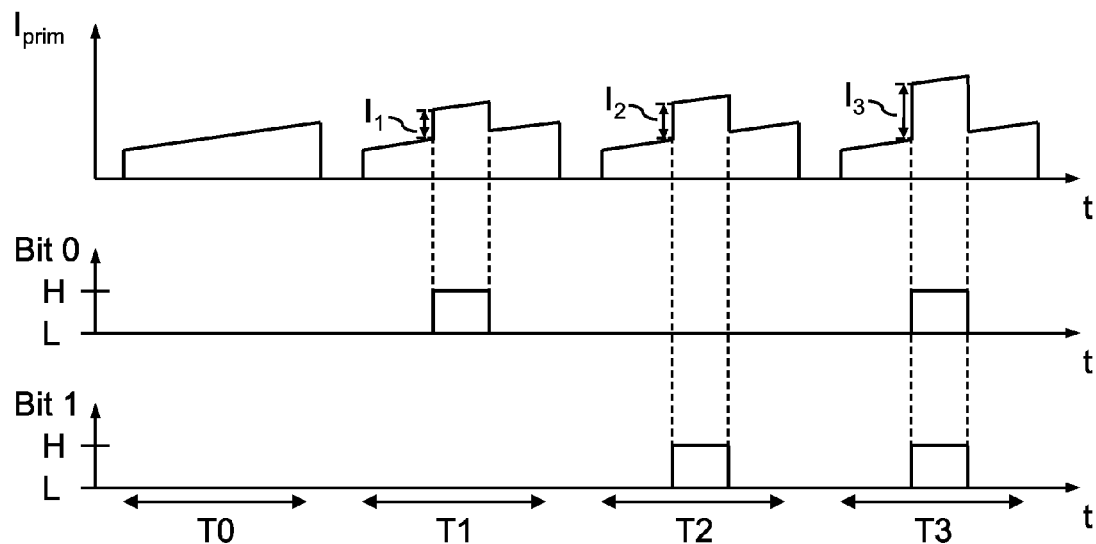
FIG. 2 shows, by way of example, using time characteristics, a principle of the data transfer between a measuring circuit and an evaluation circuit.

The measurement data can be transferred as a bit sequence, for example. In this case, for example, a word length of 12 bits per measurement value can be provided. However, other word lengths are also possible. In the case illustrated in FIG. 2, eight bits are transferred within the four time intervals T0, T1, T2, T3, wherein, in each interval, two bits ("bit 0" and "bit 1") are transferred. The time intervals are also referred to as frames. In the example in FIG. 2, only one symbol which represents two bits is transferred in each frame (serial multi-level transfer). The further timing diagrams illustrated in FIG. 2 show the state of the transferred bits ("bit 0" and "bit 1") during the respective transfer time periods T0, T1, T2, T3. A single bit can only assume one of two possible states (logic 0 or logic 1 represented, for example, by a high level H and a low level L). No differential current $\Delta I_{prim}$ is modulated onto the characteristic of the current $I_{prim}$ in the time interval T0, and the linear rise in the primary current during this time interval T0 represents the magnetization current of the transformer 30 rising during this time. A lack of change in current in a time interval (in this case T0) is represented by a 0. A differential current $\Delta I_{prim} = \Delta I_1$ is superimposed on the characteristic of the current $I_{prim}$ in the time interval T1, which corresponds to a logic 1. The corresponding bit 0 has a high level. In this way, a bit can be transferred in each time interval T0, T1, T2, T3 (i.e. in each time increment).

The example illustrated in FIG. 2 shows a multi-level transfer, in which two bits (i.e. a 2-bit word) are transferred by in each case one symbol in each time interval. The bit combinations (symbols) which can be transferred are therefore "00", "01", "10" and "11" and are represented by the lower two timing diagrams for "bit 0" and "bit 1". A bit combination "00" to be transferred corresponds to a current difference $\Delta I_{prim} = 0$ (see time interval T0), a bit combination "01" corresponds to a current difference $\Delta I_{prim} = \Delta I_1$ (see time interval T1), a bit combination "10" corresponds to a current difference $\Delta I_{prim} = \Delta I_2$ (see time interval T2) and bit combination "11" corresponds to a current difference $\Delta I_{prim} = \Delta I_3$ (see time interval T3). Said bit combinations can be decoded by a determination of the level of the modulated current difference $\Delta I_{prim}$ in each time increment T0, T1, T2, T3.

A change in the secondary current $\Delta I_{sec}$ and therefore in the primary current $\Delta I_{prim}$ does not need to be present over the entire transfer time period T0, T1, T2, T3. The change can also only be present over a relatively short time period within the transfer time period T0, T1, T2, T3, as illustrated in FIG. 2. In accordance with the same principle, it is also possible for more than two bits to be transferred during a transfer time period T0, T1, T2, T3. The change in the secondary current $\Delta I_{sec}$ and the resultant change in the primary current $\Delta I_{prim}$ can represent both an increase and a reduction in the currents.

Figure 3:
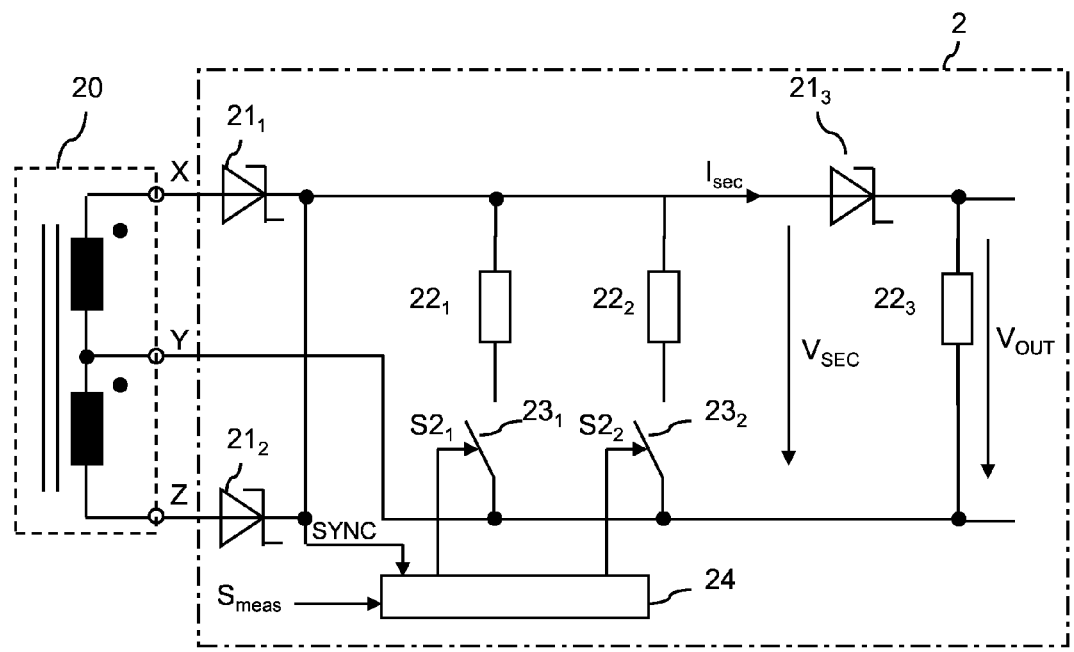
FIG. 3 shows a circuit arrangement for modulating measurement data.
Figure 4:
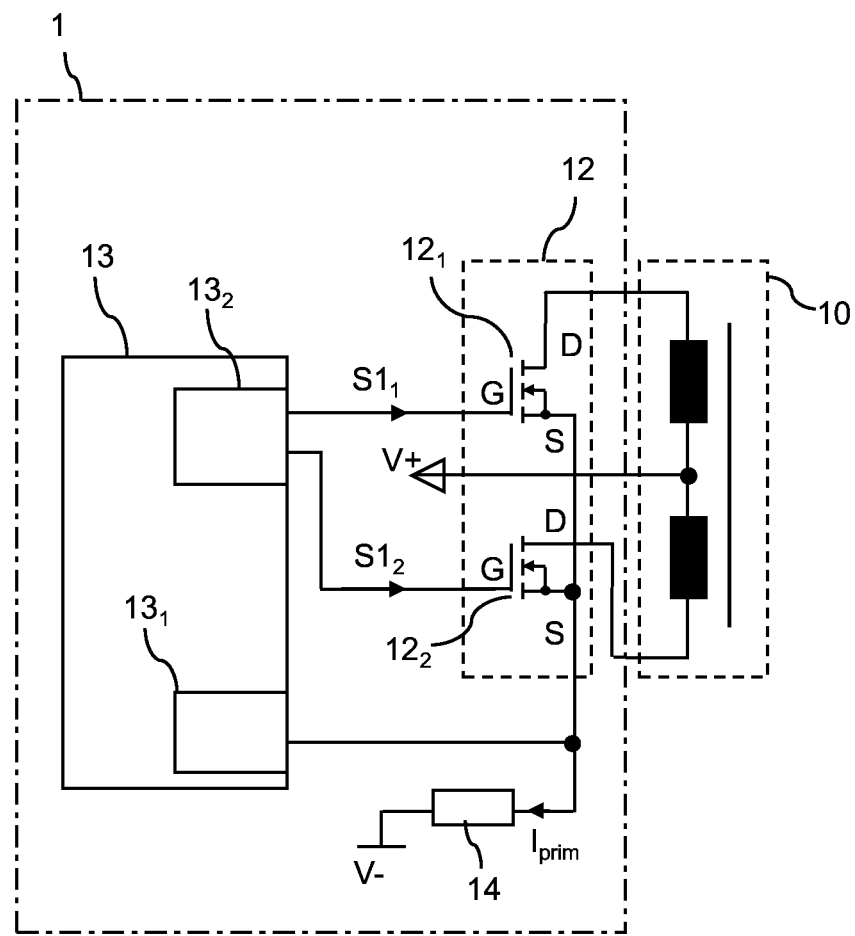
FIG. 4 shows an evaluation circuit for evaluating transferred measurement data.

FIG. 3 shows an exemplary embodiment of a transmission circuit 2, which is connected to the secondary side 20 of the transfer unit 30. As mentioned above, the transmission circuit 2 firstly provides the supply of energy to the secondary-side circuit components and secondly is used for modulating the secondary current in order to transfer data to the primary side, as explained above. Those parts of the transmission circuit which are used for the supply of energy can substantially correspond to the output circuit of a flux converter. That is to say that, in respect of the supply of energy, the evaluation circuit 1, the transformer 30 and the transmission circuit 2 operate as a switching converter with galvanic isolation (for example two-transistor flux converter, push-pull converter as illustrated in FIG. 4 or else a full-bridge converter).

In such a flux converter, during a first phase (on phase), a current $I_{prim}$ on the primary side 10 (not illustrated in FIG. 3) of the transfer unit 30 rises linearly. During this phase, a current flows through the diodes $21_1$ or $21_2$. During a second phase (freewheeling phase), the diodes $21_1$, $21_2$ are off and are therefore not energized.

A modulation of the secondary current $I_{sec}$ can be achieved, for example, by a secondary-side load resistance being varied correspondingly. By virtue of a change in the load resistance, the current consumption of the transmission circuit 2 varies, i.e. more or less current is "drawn". For this purpose, resistors $22_1$, $22_2$, $22_3$ are provided in the second circuit 2. The resistors $22_1$, $22_2$, $22_3$ are connected in parallel with one another between two connections X, Y. FIG. 3 shows three resistors, but it is possible for more or fewer resistors to be provided, for example corresponding to the number of bits to be transferred simultaneously. The transmission circuit 2 furthermore has switches $23_1$, $23_2$, wherein in each case one switch $23_1$, $23_2$ is connected in series with a resistor $22_1$, $22_2$. If a switch $23_1$, $23_2$ is open, no current can flow via the respective resistor $22_1$, $22_2$. The "basic load" is represented by the resistance value of the resistor $22_3$. By opening or closing of specific switches $23_1$, $23_2$, further resistors $22_1$, $22_2$ are connected in parallel with the resistor $22_3$, which effectively results in a reduction in the total load resistance (i.e. an increase in the load) and therefore in a correspondingly higher secondary current $I_{sec}$. Therefore, the desired modulation of the secondary current $I_{sec}$ can be achieved by virtue of the total load resistance of the second circuit 2 being varied. It is possible in this case for a switch to be provided in series with each of the resistors. However, it is also possible for resistors to be provided which do not have a switch connected in series (i.e. which are always "switched on").

In order to drive the switches $23_1$, $23_2$, the transmission circuit can have a driver circuit 24. This driver circuit 24 is designed to provide driver signals $S2_1$, $S2_2$ for driving the switches $23_1$ and $23_2$. The driver signals $S2_1$, $S2_2$ can assume two states, for example. If a drive signal $S2_1$, $S2_2$ assumes a first state ($S2_1=1$ or $S2_2=1$), the corresponding switch $23_1$, $23_2$ is closed, for example. If a drive signal $S2_1$, $S2_2$ assumes a second state ($S2_1=0$ or $S2_2=0$), the corresponding switch $23_1$, $23_2$ is open, for example. The driver circuit 24 is therefore designed to adjust the state of the driver signals $S2_1$, $S2_2$ on the basis of the measurement signal $S_{meas}$ to be transferred (and therefore on the basis of the data to be transferred). In this case, the switch-on and switch-off times of the switches $23_1$, $23_2$ are synchronized with the switching edges in the secondary-side voltage $V_{sec}$ and therefore synchronized with the switching edges in the primary-side AC voltage $V_{PRIM}$. The synchronization takes place with the aid of the driver circuit 24, which controls the timing of the signals illustrated in FIG. 2.

FIG. 4 shows an exemplary embodiment of the evaluation circuit 1, which is connected to the primary side 10 of the transfer unit 30. As already mentioned, the evaluation circuit 1 ensures both reception and evaluation of the transmitted data and provides a voltage supply to the circuits connected to the secondary side (transmission circuit 2, measuring circuit 50). The evaluation circuit 1 has a switching unit 12 comprising a first power transistor $12_1$ and a second power transistor $12_2$. The power transistors $12_1$, $12_2$ operate as switches. By driving of the power transistors $12_1$, $12_2$ with suitable driver signals, said power transistors can be switched on (on phase) and off (off phase). During the on phase, the primary current rises approximately linearly and energy is transferred to the secondary side via the coils of the primary side 10 of the transformer 30. If the power transistors 12$_1$, 12$_2$ are turned off, the current through the respective transistor 12$_1$, 12$_2$ is interrupted.

The driver signals S1$_1$, S1$_2$ for driving the power transistors 12$_1$, 12$_2$ can be provided by a microcontroller 13, for example. Said microcontroller can have a PWM modulator 13$_2$ for this purpose, for example. In the present example, the switching unit 12 is connected to a connection for a positive potential V+ via the primary side 10 of the transfer unit 30 and to a connection for a negative potential V− via an (optional) resistor 14. The resistor 14 can be used, for example, as measuring resistor for measuring the primary current I$_{prim}$. The primary current I$_{prim}$ causes a voltage drop in the measuring resistor 14 which is proportional to the primary current I$_{prim}$.

A change in the secondary current I$_{sec}$, as already described, does not need to take place over an entire transfer time period (frame, cf. time intervals T0 to T1 in FIG. 2), during which one of the transistors 12$_1$, 12$_2$ is on, but can also only take place during a specific time segment within the transfer time periods. In order to be able to detect such short-term changes in current during a transfer time period, the primary current can be sampled at specific sampling times, for example. For this purpose, the microcontroller can have an analog-to-digital converter (ADC) 13$_1$, for example, which implements the sampling and is triggered with the aid of the PWM modulator 13$_2$, for example.

Figure 5:
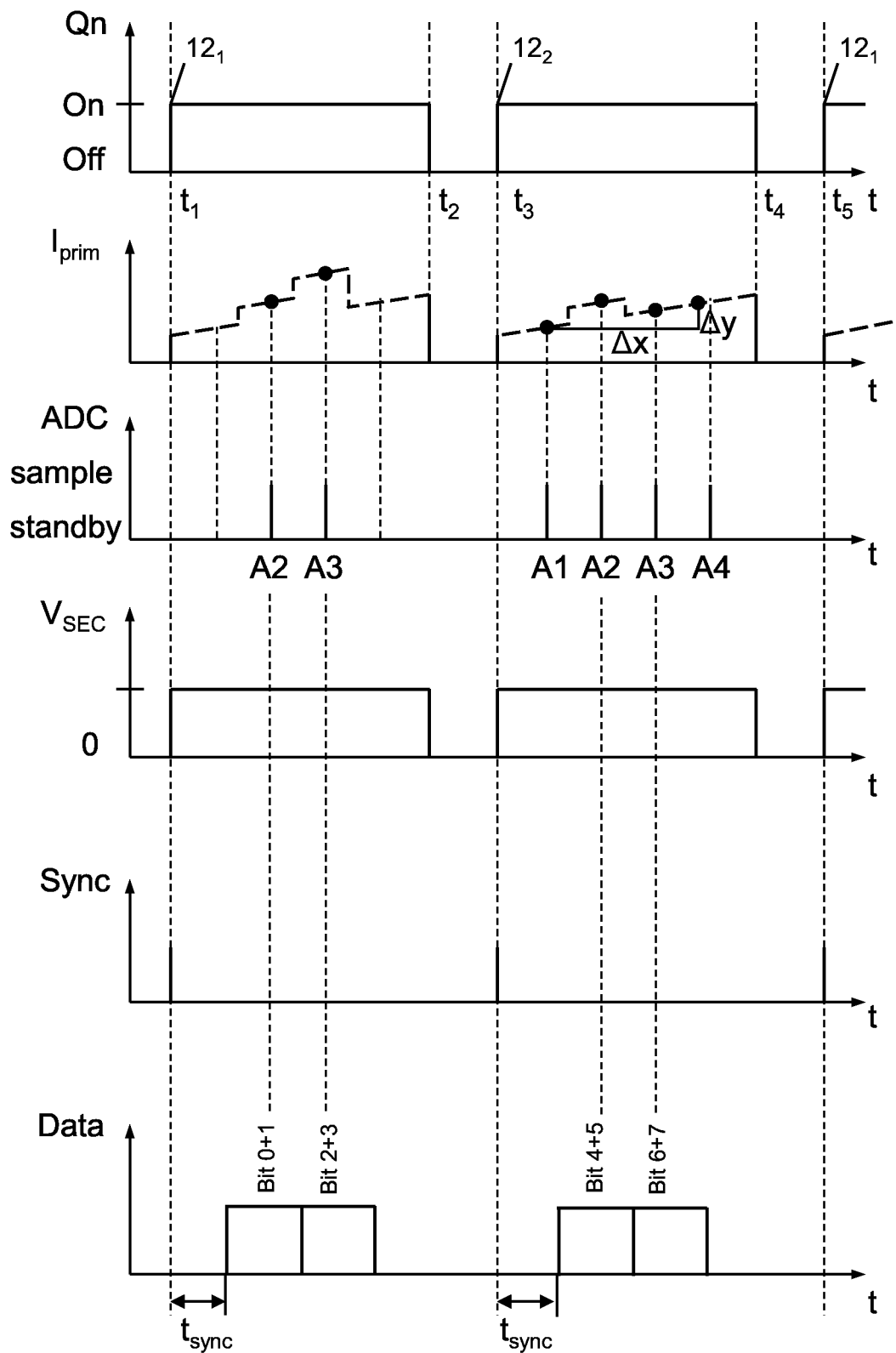
FIG. 5 shows the time sequence of various operations in an arrangement for transferring data between a measuring circuit and an evaluation circuit.

FIG. 5 shows various transfer time periods. During a first transfer time period (time t$_1$ to t$_2$), the first power transistor 12$_1$ is in the switched-on state. During a second transfer time period (time t$_3$ to t$_4$), the second power transistor 12$_2$ is in the switched-on state. During these frames or transfer time periods (t$_1$ to t$_2$ and t$_3$ to t$_4$), a primary current I$_{prim}$ flows through the transformer and via the resistor 14. During the switch-on phase of a power transistor 12$_1$, 12$_2$ which lasts up to time t$_2$ (end of the switch-on phase of the first power transistor 12$_1$) or t$_4$ (end of the switch-on phase of the second power transistor 12$_2$), the secondary current I$_{sec}$ is modulated as explained above, which results in a corresponding change in the primary current I$_{prim}$. In the present example, the secondary current I$_{sec}$ is not only changed once during a frame, as described in relation to FIG. 2. Instead, two changes in the current during a frame (transfer time period) are provided for the transfer of two symbols (i.e. bits or, in the case of multi-level transfer, bit groups). In the case of multi-level transfer, as shown in FIG. 2 with four different levels (0, Δi$_1$, Δi$_2$, Δi$_3$), four bits (in the form of two symbols) can be transferred in one frame (t$_1$ to t$_2$ or t$_3$ to t$_4$). If the primary current I$_{prim}$ is sampled at corresponding sampling times A2 and A3, these changes can be detected. As already described in relation to FIG. 2, one or more bits can be transferred simultaneously at a sampling time. For example, two bits (first symbol: bits 0+1) are transferred at sampling time A2 and two further bits (second symbol: bits 2+3) are transferred at sampling time A3. By virtue of transferring more than two bits at a sampling time or by virtue of the provision of further transfer levels and corresponding sampling times during the transfer time period, it is also possible for more than four bits to be transferred per frame (transfer time period). If necessary, however, it is also possible for fewer than four bits to be transferred per transfer time period. It is also possible for more than two symbols to be transferred per frame (sequentially).

In some applications it is necessary, for example, to detect and transfer the DC link voltage of a secondary-side converter in intervals of less than 100 microseconds (μs). If, for example, data transfer with 12 bits per measurement value including a start bit and a stop bit is provided, there is a minimum data rate of 120 kbits/s (10 000·12 bits/measurement value). At a switching frequency of 200 kHz (frequency of the secondary-side voltage V$_{sec}$), a data rate of 800 kbits/s can be achieved, for example. In the example shown in FIG. 5, the switching frequency would be f$_S$=(t$_3$−t$_1$)$^{-1}$.

In order that the changes in the primary current I$_{prim}$ can be identified reliably, provision can be made for the times at which the modulation is implemented on a secondary side to be synchronized with the sampling times A2, A3. The voltage V$_{sec}$ on the secondary side 20 of the transfer device 30 is determined by the voltage on the primary side 10. If the primary side 10 is driven by a square-wave voltage, a square-wave voltage V$_{sec}$ also results on the secondary side. The rising edges of this secondary voltage V$_{sec}$ can be detected, for example. If a rising edge is detected at a time t$_1$, for example, the secondary-side current I$_{sec}$ can be modulated correspondingly after elapse of a synchronization time t$_{sync}$ in order to transfer the first two bits (bits 0+1). Thereafter, a further modulation can be implemented in order to transfer two further bits (bits 2+3). The sampling times A2 and A3 are then in the center (in time) of a bit or symbol to be sampled, for example.

As already described above, the primary current I$_{prim}$ comprises the secondary current I$_{sec}$ converted by means of the transfer unit and a linearly rising magnetization current. This magnetization current can falsify the measurement on the primary side. For this reason, further sampling times can be provided. As shown in FIG. 5 for the second transfer time period (switch-on phase of the second power transistor 12$_2$), first sampling A1 can take place at the beginning of the transfer time period, for example even before sampling time A2. The first sampling A1 can take place, for example, even during the synchronization time t$_{sync}$. A further additional sampling A4 can take place at the end of the transfer time period, after sampling time A3. If the secondary current I$_{sec}$ does not change both at the first sampling time A1 and at the last sampling time A4, or changes by the same magnitude at both sampling times, the gradient m of the magnetization current can be determined as follows, for example:

$$m=(I_{prim}(A4)-I_{prim}(A1))/(A4-A1).$$

This gradient m represents a systematic error in the measurements at the sampling times A2 and A3. Then, the current values measured at the sampling times A2 and A3 can be corrected in the microcontroller 13 corresponding to the gradient m determined.

A transfer time period can have, for example, a specific minimum duration in order to ensure safe measurement at all four positions A1, A2, A3, A4. In this case, a jitter can also be included in the calculations by virtue of the minimum duration being selected to be so long that the last measurement at the sampling time A4 can also be implemented despite possible jitter safely during the transfer time period.

As mentioned above, start and stop bits (or start and stop symbols) can also be transmitted for synchronization of frame (t$_1$ to t$_2$, t$_3$ to t$_4$) and sampling times (A1 to A4). The start and stop bits (or symbols) are in this case transmitted at the beginning or at the end of a frame (transfer time period). If a data word to be transferred comprises 12 bits, for example, three frames of in each case four bits are necessary for the transfer of said data word in the present example (multi-level transfer with two symbols or four bits per frame) (three frames with in each case two symbols, two bits per symbol). In order to mark the beginning and the end of a data word, a start symbol is introduced in the first frame and a stop symbol is introduced in the last frame of a data word.

Figure 6:
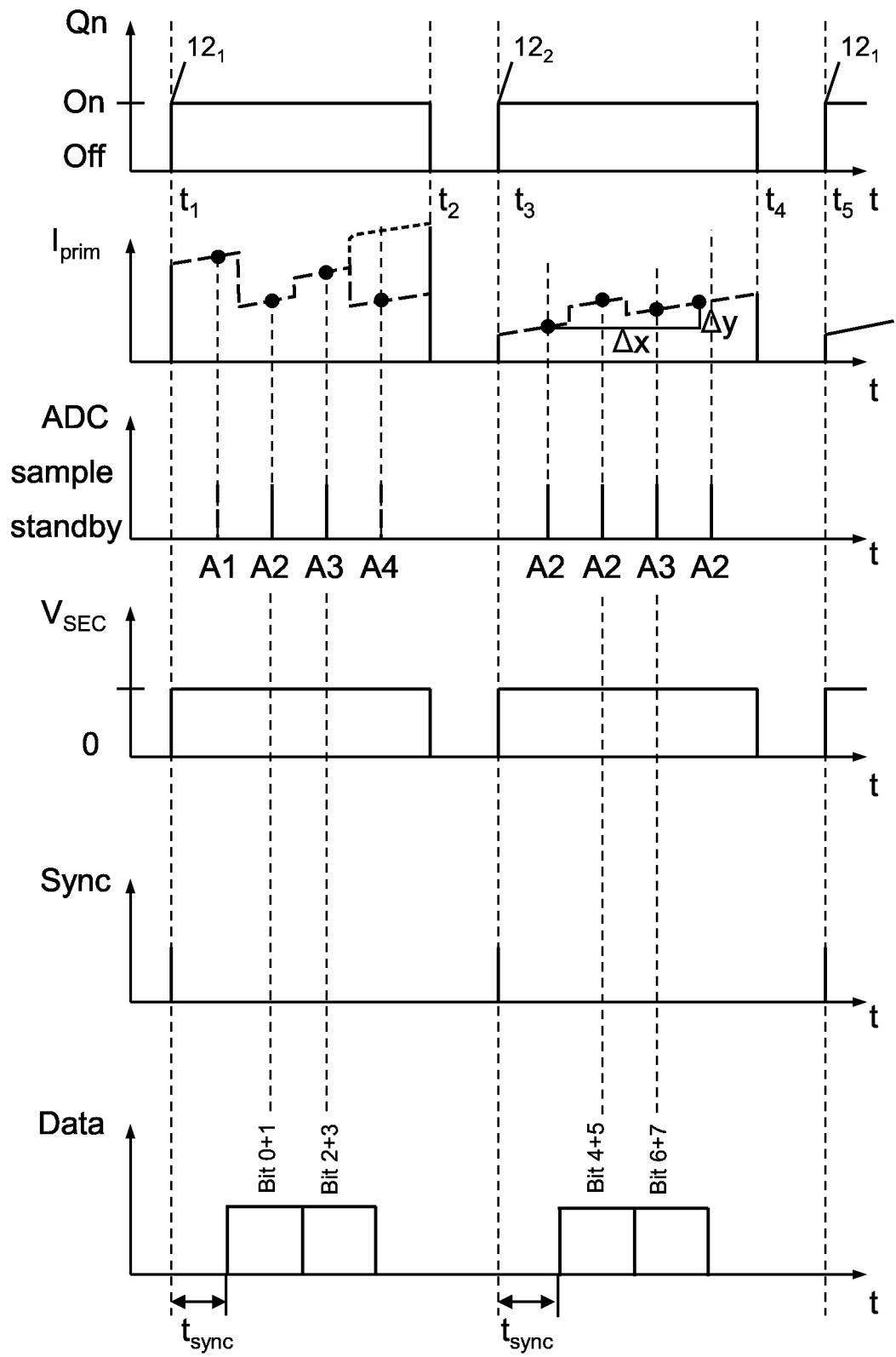
FIG. 6 shows the same time sequences as in FIG. 5, but with start and stop bits being transferred.

Transfer with start and stop symbols is illustrated in FIG. 6. Apart from the start and stop symbols, this transfer is identical to that shown in FIG. 5. In the present example, the start symbol is not transmitted instead of a "normal" symbol, but is transmitted prior to the time interval in which the first bit of a frame is normally transmitted. A start symbol is therefore sampled at the sampling time A1. Similarly, the stop symbol is not transmitted instead of a "normal" symbol, but is transmitted after the time interval in which the last bit of a frame is normally transmitted. A stop symbol is therefore sampled at the sampling time A4.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:
   a power electronics circuit;
   a measuring circuit designed to measure at least one physical parameter occurring in the power electronics circuit and to provide a measurement signal which represents the measured parameter;
   a transfer unit with a primary side and a secondary side;
   a transmission circuit coupled to the secondary side; and
   an evaluation circuit coupled to the primary side and galvanically isolated from the transmission circuit by the transfer unit,
   wherein the evaluation circuit is designed to supply an AC voltage to the primary side of the transfer unit, as a result of which a corresponding primary current flows on the primary side, which results in a secondary current on the secondary side of the transfer unit, the secondary current being supplied to the transmission circuit;
   wherein the transmission circuit is designed to receive the measurement signal from the measuring circuit and modulate the secondary current in accordance with the measurement signal, which results in a corresponding modulation of the primary current,
   wherein the evaluation circuit is further designed to evaluate the modulation of the primary current and to generate an output signal dependent on the evaluation.

2. The power semiconductor module of claim 1, wherein the power electronics circuit comprises at least one half-bridge coupled to a DC link, and wherein the power electronics circuit is designed to generate an AC voltage from a DC voltage of the DC link.

3. The power semiconductor module of claim 2, wherein each of the at least one half-bridges comprises at least two power transistors.

4. The power semiconductor module of claim 1, wherein the at least one measured parameter of the power electronics circuit is a voltage, a current or a temperature.

5. The power semiconductor module of claim 1, wherein the transmission circuit is designed to perform the modulation by virtue of varying the secondary current by a known value.

6. The power semiconductor module of claim 1, wherein the AC voltage supplied to the primary side results in on phases alternating with off phases of the power semiconductor module, wherein the on phases represent transfer time periods in which the primary current is flowing and an evaluation can take place.

7. The power semiconductor module of claim 6, wherein the measurement signal is transferred during one transfer time period or during two or more successive transfer time periods.

8. The power semiconductor module of claim 1, wherein the measurement signal is transferred by means of a bit sequence comprising at least two bits, wherein each bit can assume a first state and a second state.

9. The power semiconductor module of claim 8, wherein, during a transfer time period, a total number of bits is transferred, wherein the total number can comprise one or more bits.

10. The power semiconductor module of claim 9, wherein as a result of a change in the secondary current by a specific magnitude, a first number of the total number of bits in the first state is transferred, and a second number of the total number of bits in the second state is transferred, wherein both the first number and the second number can comprise no, one or more bits.

11. The power semiconductor module of claim 10, wherein the change in the secondary current does not take place over the entire transfer time period.

12. The power semiconductor module of claim 11, wherein during a transfer time period, more than one change in the secondary current takes place.

13. The power semiconductor module of claim 1, wherein the transmission circuit has a variable load resistance and is designed to modulate the secondary current by virtue of a change in the load resistance.

14. The power semiconductor module of claim 13, wherein the variable load resistance comprises at least two resistors connected in parallel with one another.

15. The power semiconductor module of claim 14, wherein a switching element is connected in series with at least one of the resistors, and wherein the load resistance can be varied by corresponding opening and closing of the switching elements.

16. The power semiconductor module of claim 15, wherein the transmission circuit further comprises a drive unit designed to open or close the switching elements corresponding to the measurement signal.

17. The power semiconductor module of claim 1, wherein the evaluation circuit comprises a measuring resistor for measuring the primary current.

18. The power semiconductor module of claim 1, wherein the evaluation circuit is designed to measure the primary current at one or more predetermined sampling times during a transfer time period in order to evaluate the modulation of the primary current.

19. The power semiconductor module of claim 18, wherein the evaluation circuit is designed to sample the primary current at two or more additional sampling times in order to determine a gradient of the primary current.

20. The power semiconductor module of claim 18, wherein the transmission circuit is designed to determine the time of rising edges of a voltage induced on the secondary side.

21. The power semiconductor module of claim 20, wherein the transmission circuit is designed to implement the modulation after elapse of a synchronization time after the determined time of the rising edges.

22. The power semiconductor module of claim 1, wherein the transfer unit is designed to transfer energy from the first circuit to the transmission circuit.

23. The power semiconductor module of claim 1, wherein the transfer unit comprises a transformer.

* * * * *